(12) United States Patent

Park et al.

(10) Patent No.: US 8,582,898 B2
(45) Date of Patent: Nov. 12, 2013

(54) METHOD AND APPARATUS FOR ENCODING AND DECODING IMAGE BASED ON CODE TABLE SELECTION ADAPTED TO RESIDUAL VALUE DISTRIBUTION

(75) Inventors: Sung-bum Park, Seongnam-si (KR); Jung-woo Kim, Seoul (KR); Dai-woong Choi, Seoul (KR); Jae-won Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 956 days.

(21) Appl. No.: 12/554,390

(22) Filed: Sep. 4, 2009

(65) Prior Publication Data

US 2010/0232722 A1   Sep. 16, 2010

(30) Foreign Application Priority Data

Mar. 11, 2009   (KR) ........................ 10-2009-0020734

(51) Int. Cl.
   *G06K 9/36*   (2006.01)

(52) U.S. Cl.
   USPC ........................................... 382/232

(58) Field of Classification Search
   USPC ................................... 382/232–253
   See application file for complete search history.

(56) References Cited

U.S. PATENT DOCUMENTS

| | | | |
|---|---|---|---|
| 5,680,129 A | 10/1997 | Weinberger et al. | |
| 5,764,374 A * | 6/1998 | Seroussi et al. | 382/244 |
| 5,903,676 A | 5/1999 | Wu et al. | |
| 6,021,227 A * | 2/2000 | Sapiro et al. | 382/239 |
| 2002/0039449 A1 * | 4/2002 | Nouda | 382/238 |
| 2005/0169374 A1 * | 8/2005 | Marpe et al. | 375/240.16 |
| 2007/0217703 A1 * | 9/2007 | Kajiwara | 382/238 |

* cited by examiner

*Primary Examiner* — Alex Liew
(74) *Attorney, Agent, or Firm* — Sughrue Mion, PLLC

(57) ABSTRACT

A method and apparatus are provided for encoding and decoding an image which entropy encode and decode a residual value of a current pixel in consideration of a context model determined with reference to at least one pixel value that is encoded and decoded before the current pixel and distribution of the residual values encoded and decoded according to the determined context model.

19 Claims, 5 Drawing Sheets

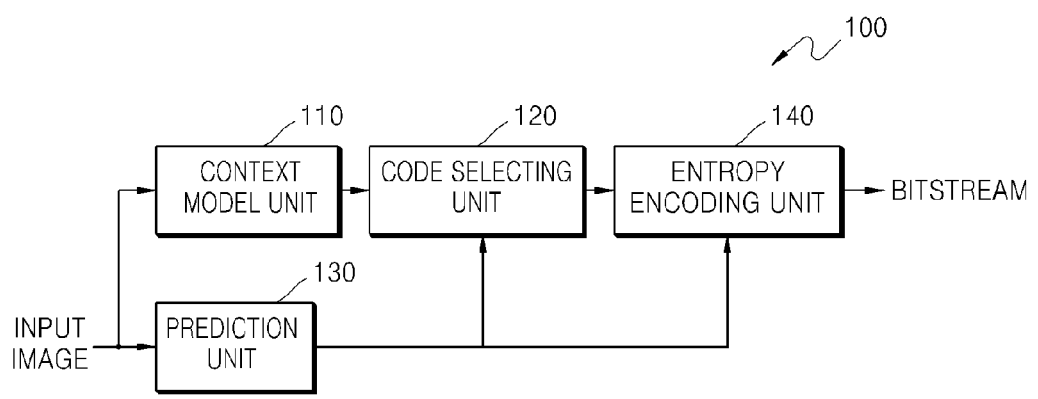

| CONTEXT MODEL INDEX | CONTEXT MODEL PARAMETER | GOLOMB PARAMETER |
|---|---|---|
| Q = 0 | $N_1[0], A_1[0]$ | $K_{01}$ |
|  | $N_2[0], A_2[0]$ | $K_{02}$ |
| Q = 1 | $N_1[1], A_1[1]$ | $K_{11}$ |
|  | $N_2[1], A_2[1]$ | $K_{12}$ |
| Q = 2 | $N_1[2], A_1[2]$ | $K_{21}$ |
|  | $N_2[2], A_2[2]$ | $K_{22}$ |
| ... | ... | ... |

FIG. 5

| | | GOLOMB PARAMETER (k) | | | |
|---|---|---|---|---|---|
| | | 0 | 1 | 2 | 3 |
| RESIDUAL VALUE | 0 | 1 | 10 | 100 | 1000 |
| | 1 | 01 | 11 | 101 | 1001 |
| | 2 | 001 | 010 | 110 | 1010 |
| | 3 | 0001 | 011 | 111 | 1011 |
| | 4 | 00001 | 0010 | 0100 | 1100 |
| | 5 | 000001 | 0011 | 0101 | 1101 |
| | 6 | 0000001 | 00010 | 0110 | 1110 |
| | 7 | 00000001 | 00011 | 0111 | 1111 |
| | 8 | 000000001 | 000010 | 00100 | 01000 |
| | 9 | 0000000001 | 000011 | 00101 | 01001 |
| | 10 | 00000000001 | 0000010 | 00110 | 01010 |
| | 11 | 000000000001 | 0000011 | 00111 | 01011 |
| | 12 | 0000000000001 | 00000010 | 000100 | 01100 |
| | 13 | 00000000000001 | 00000011 | 000101 | 01101 |
| | 14 | 000000000000001 | 000000010 | 000110 | 01110 |
| | 15 | 0000000000000001 | 000000011 | 000111 | 01111 |
| | ... | ... | ... | ... | ... |

METHOD AND APPARATUS FOR ENCODING AND DECODING IMAGE BASED ON CODE TABLE SELECTION ADAPTED TO RESIDUAL VALUE DISTRIBUTION

CROSS-REFERENCE TO RELATED PATENT APPLICATION

This application claims priority from Korean Patent Application No. 10-2009-0020734, filed on Mar. 11, 2009, in the Korean Intellectual Property Office, the disclosure of which is incorporated herein in its entirety by reference.

BACKGROUND OF THE INVENTION

1. Field of the Invention

Methods and apparatuses consistent with the present invention relate to encoding and decoding an image, and more particularly, to entropy encoding and entropy decoding residual values.

2. Description of the Related Art

In image compression methods such as moving picture experts group (MPEG)-1, MPEG-2, MPEG-4 H.264/MPEG-4 Advanced Video coding (AVC), a picture is divided into macro blocks in order to encode an image. When predictive blocks are generated using inter prediction or intra prediction, the predictive blocks are subtracted from original blocks, thereby generating residual blocks.

Residual values of the residual blocks are discrete cosine transformed (DCT) to be in the frequency domain and discrete cosine coefficients generated as a result of the transformation are quantized. The quantized discrete cosine coefficients are entropy encoded through binarization and arithmetic coding and image data is generated.

In such a method of encoding an image in block units, the image may be damaged during quantization of the discrete cosine coefficients. However, the damage of the image is accepted due to improved compressibility and the image is encoded using DCT and quantization.

In addition, in an image encoding method such as Lossless JPEG, JEPG-LS, or XENA, DCT and quantization are not used and instead, pixel values are directly entropy encoded. Each of the pixel values are predicted in order to generate predicted values and the predicted values are subtracted from the pixel values, thereby generating residual values with respect to each of the pixel values. Then, the generated residual values are entropy encoded. Entropy encoding of the residual values using context models determined with reference to the pixel value(s) that are encoded before current pixels shows high performance in terms of compression.

SUMMARY OF THE INVENTION

Exemplary embodiments of the present invention provide a method and apparatus for entropy encoding and entropy decoding residual values and a computer readable recording medium having embodied thereon a program for executing the method.

According to an aspect of the present invention, there is provided a method of encoding an image, the method including: determining a context model to be used to entropy encode a residual value of a current pixel with reference to at least one pixel value that is encoded before the current pixel; determining a residual value group according to characteristics of an image area, to which the residual value belongs, from among a plurality of residual value groups encoded based on the determined context model; selecting a code table based on the determined context model and the determined residual value group; and entropy encoding the residual value according to the selected code table.

The residual value group according to the characteristics of the image area may be determined according to the distribution of the residual values included in the image area.

The selecting of the code table may include: determining Golomb code parameters based on the determined context model and the determined residual value group; and selecting a Golomb code table to be used to entropy encode the residual value according to the determined Golomb code parameters.

The Golomb code parameters may be determined based on a context model parameter of the determined residual value group from among context model parameters allocated to each of the plurality of residual value groups.

The context model parameter of the determined residual value group may include a parameter indicating the number of pixels included in the determined residual value group from among the at least one pixel that is encoded before an image processing unit including the current pixel and a parameter for the sum total of the absolute values of the residual value of the pixels included in the determined residual value group.

According to another aspect of the present invention, there is provided a method of decoding an image, the method including: determining a context model to be used to entropy decode a residual value of a current pixel with reference to at least one pixel value that is decoded before the current pixel; selecting a code table based on the determined context model and an index indicating a residual value group according to the characteristic of an image area, to which the residual value belongs, from among a plurality of residual value groups decoded based on the determined context model; and entropy decoding the residual value according to the selected code table.

According to another aspect of the present invention, there is provided an apparatus for encoding an image, the apparatus including: a context model unit determining a context model to be used to entropy encode a residual value of a current pixel with reference to at least one pixel value that is encoded before the current pixel; a code selecting unit determining a residual value group according to characteristics of an image area, to which the residual value belongs, from among a plurality of residual value groups encoded based on the determined context model and selecting a code table based on the determined context model and the determined residual value group; and an entropy encoding unit entropy encoding the residual value according to the selected code table.

According to another aspect of the present invention, there is provided an apparatus for decoding an image, the apparatus including: a context model unit determining a context model to be used to entropy decode a residual value of a current pixel with reference to at least one pixel value that is decoded before the current pixel; a code selecting unit selecting a code table based on the determined context model and an index indicating a residual value group according to characteristics of an image area, to which the residual value belongs, from among a plurality of residual value groups decoded based on the determined context model; and an entropy decoding unit entropy decoding the residual value according to the selected code table.

According to another aspect of the present invention, there is provided a computer readable recording medium having embodied thereon a computer program for executing the methods above.

BRIEF DESCRIPTION OF THE DRAWINGS

The above and other features and aspects of the present invention will become more apparent by describing in detail exemplary embodiments thereof with reference to the attached drawings in which:

FIG. 1 is a block diagram of an apparatus for encoding an image according to an exemplary embodiment of the present invention;

FIG. 2 is a view for illustrating a method of determining a context model according to an exemplary embodiment of the present invention;

FIG. 5 is a table showing a Golomb code table according to an exemplary embodiment of the present invention;

DETAILED DESCRIPTION OF EXEMPLARY EMBODIMENTS OF THE INVENTION

Figures 3, 4:
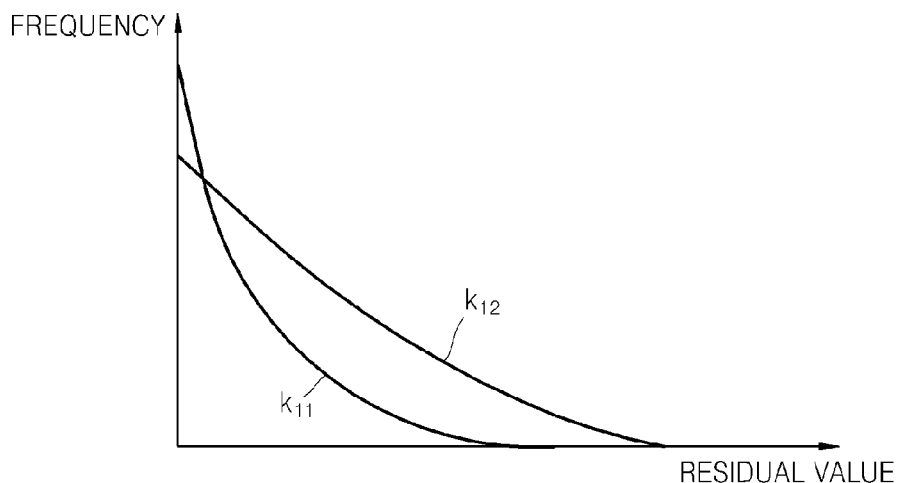
FIG. 3 is a graph showing a plurality of residual value distributions according to an exemplary embodiment of the present invention.
FIG. 4 is a table showing context model parameters for a plurality of residual value groups according to an exemplary embodiment of the present invention.

Hereinafter, exemplary embodiments of the present invention are described in more detail with reference to accompanying drawings.

FIG. 1 is a block diagram of an apparatus 100 for encoding an image according to an exemplary embodiment of the present invention.

Referring to FIG. 1, the apparatus 100 for encoding an image includes a context model unit 110, a code selecting unit 120, a prediction unit 130, and an entropy encoding unit 140.

The context model unit 110 determines a context model to be used in entropy encoding a residual value of a current pixel with reference to at least one pixel value that is encoded before the current pixel.

As described above, in an image encoding method such as Lossless JPEG, JEPG-LS, or XENA, discrete cosine transformation (DCT) and quantization are not used and instead, pixel values are directly entropy encoded. Also, a residual value having a small absolute value is encoded to improve compressibility without directly entropy decoding the pixel value. In addition, in encoding the residual value, the context model is determined with reference to at least one pixel value, that is encoded before the current pixel and is adjacent to the current pixel, and the residual value is entropy encoded according to the determined context model, thereby improving compressibility. Thus, the context model unit 110 determines the context model to be used in entropy encoding the residual value, as will be described more fully with reference to FIG. 2.

FIG. 2 is a view for illustrating a method of determining the context model according to an exemplary embodiment of the present invention.

Referring to FIG. 2, the context model to be used in entropy encoding the residual value of a current pixel x 210 is determined with reference to encoded pixel values 220 through 226 that are encoded before the current pixel x 210 and are adjacent to the current pixel x 210.

JPEG-LS from among Lossless JPEG, JEPG-LS, and XENA mentioned above will now be described. However, the exemplary embodiment may be applied to other image encoding methods for entropy encoding a current pixel using the context model, instead of applying the JPEG-LS standard.

Gradient values of the encoded pixel values 220 through 226, that are encoded before the current pixel x 210 and are adjacent to the current pixel x 210, are used to determine the context model.

$$D_1 = Rd - Rb$$

$$D_2 = Rb - Rc$$

$$D_3 = Rc - Ra \qquad \text{[Equation 1]}$$

Wherein $D_1$, $D_2$ and $D_3$ are the gradient values. Ra is a value restored after encoding the pixel value of a pixel position a 220, Rb is a value restored after encoding the pixel value of a pixel position b 222, Rc is a value restored after encoding the pixel value of a pixel position c 224, and Rd is a value restored after encoding the pixel value of a pixel position d 226.

In a lossless image encoding method, Ra is the same as the pixel value of the pixel position a 220, Rb is the same as the pixel value of the pixel position b 222, Rc is the same as the pixel value of the pixel position c 224, and the Rd is the same as the pixel value of the pixel position d 226. When $D_1$, $D_2$ and $D_3$ are calculated, a range of the values of $D_1$, $D_2$ and $D_3$ may be determined.

$$\text{if}(D_i <= -T_3), Q_i = -4;$$

$$\text{else if}(D_i <= -T_2), Q_i = -3;$$

$$\text{else if}(D_i <= -T_1), Q_i = -2;$$

$$\text{else if}(D_i < -\text{NEAR}), Q_i = -1;$$

$$\text{else if}(D_i <= \text{NEAR}), Q_i = 0;$$

$$\text{else if}(D_i <= T_1), Q_i = 1;$$

$$\text{else if}(D_i <= T_2), Q_i = 2;$$

$$\text{else if}(D_i <= T_3), Q_i = 3;$$

$$\text{else } Q_i = 4; \qquad \text{[Equation 2]}$$

wherein $T_1$, $T_2$, $T_3$, and NEAR are threshold values for classifying the gradient values and are positive numbers, which may vary according to embodiments of the present invention. According to the present embodiment, $T_1$, $T_2$, and $T_3$ may respectively be set to 3, 7, and 21. In a lossless image encoding and decoding method, NEAR is set to 0.

According to Equation 2, when $Q_1$, $Q_2$, and $Q_3$ are determined with respect to the $D_1$, $D_2$ and $D_3$, vectors $(Q_1, Q_2, Q_3)$ are generated and the generated vectors correspond, on a one-to-one basis, to Q, which is an index of the context mode, thereby determining the context model.

For example, when 365 vectors $(Q_1, Q_2, Q_3)$ determined by $D_1$, $D_2$ and $D_3$ exist, vectors correspond, on a one-to-one basis, to Q, which is a positive number in a range of 0 to 364. This exemplary embodiment may be used for determining the context model based on the JPEG-LS standard.

Referring back to FIG. 1, information about the context model determined in the context model unit 110 is referred to by the code selecting unit 120 in order to select a code table to be used in entropy encoding the residual value of the current pixel.

The code selecting unit 120 determines a residual value group according to the characteristics of an image area, to which the residual value of the current pixel belongs, from among a plurality of residual value groups encoded based on the context model determined in the context model unit 110, as will be described more fully with reference to FIG. 3.

FIG. 3 is a graph showing a plurality of residual value distributions according to an exemplary embodiment of the present invention.

Referring to FIG. 3, the residual values encoded based on one context model determined in the context model unit 110 may represent a plurality of residual value distributions. For example, in processing a predetermined image processing unit (for example, a residual block including the current pixel), when the context model unit 110 sets the context model index Q to 0, the residual values encoded based on one context model index Q may represent a plurality of residual value distributions, as illustrated in FIG 3. In other words, the residual values based on one context model may represent a plurality of residual value distributions showing optimum compressibility when the residual values are encoded by a parameter $k_{11}$ or a parameter $k_{12}$ of a Golomb code.

According to the related art, it is assumed that the residual values encoded based on one context model represent one residual value distribution and a parameter k of a Golomb code is determined. However, since the residual values based on one context model may comply with a plurality of distributions as illustrated in FIG. 3, the code selecting unit 120 may determine the residual value distribution of the residual value of the current pixel generated in the prediction unit 130 according to the characteristics of the image area to which the current pixel belongs. According to the determined residual value distribution, the residual value group, to which the current pixel belongs, is determined.

The residual value distribution for a texture area, in which prediction is inaccurate, may be different from the residual value distribution for a plane area, in which prediction is accurate. Accordingly, in the present exemplary embodiment, the residual value distribution may vary according to the image area to which the current pixel belongs and thus the residual value distribution of the residual value of the current pixel may be determined.

There is no limitation to determine the residual value distribution based on the characteristics of the image area and to determine the residual value group of the current pixel according to the determined residual value distribution.

For example, the code selecting unit 120 may encode the current residual block, which is a local image area including the current pixel, by using a third encoding method such as Hoffman coding, and determines the residual value group in a block unit based on the encoding result. A Hoffman Coding code table, which shows the highest compressibility when the residual values representing a first residual value distribution are entropy encoded, is used to encode the residual values included in the current residual block. Here, when the compressibility is high, the residual values of the current residual block are determined to comply with the first residual value distribution. On the other hand, when the compressibility is low, the residual values of the current residual block are determined to comply with the other distribution, which is a second residual value distribution.

The code selecting unit 120 selects a code table to be used in entropy encoding the residual value of the current pixel based on the context model determined in the context model unit 110 and the residual value group to which residual value of the current pixel belongs.

According to the present exemplary embodiment, context model parameters vary according to not only the context model but also the residual value group. Thus, context model parameters that are each different from each other in the residual value groups are used to select the code table to be used in entropy encoding the residual values of the current pixel.

Parameters of a Golomb code to be used in entropy encoding the residual value of the current pixel are determined and the Golomb code table is selected according to the determined Golomb code parameters. A method of determining the parameters of the Golomb code is described in more detail.

FIG. 4 is a table showing context model parameters for a plurality of residual value groups according to an exemplary embodiment of the present invention.

Referring to FIG. 4, the context model parameters that are different from each other exist in the plurality of residual value groups encoded based on one context model. For example, each different context model parameters $N_1[0]$, $A_1[0]$ and $N_2[0]$, $A_2[0]$ may exist in two residual value groups which comply with the context model in which the context model index Q is set to 0.

Here, $N_i[Q]$ is a parameter indicating the number of pixels included in a residual value group i, which is the same as the current pixel from among the at least one pixel that is encoded before the image processing unit to which the current pixel belongs, and $A_i[Q]$ is a parameter indicating the sum total of the absolute value of the residual value of the pixels included in the residual value group i, which is the same as the current pixel.

According to the related art, the context model parameters are not related to the residual value groups. In other words, the context model parameters as N[Q] and A[Q] are determined regardless of the residual value groups. The context model parameters are determined according to the context model index Q regardless of the residual value distribution with which the residual value of the current pixel complies. However, according to the present embodiment, the context model parameters as N[Q] and A[Q] are determined by the context model index Q and the index 'i' indicating the residual value group.

When the context model parameters N[Q] and A[Q] are determined based on the context model index Q determined in the context model unit 110 and the residual value group to which the residual value of the current pixel belong, the code selecting unit 120 selects the Golomb code table to be used in entropy encoding the current pixel based on the determined context model parameters. A method of selecting the Golomb code table to be used in entropy encoding based on the context model parameters N[Q] and A[Q] is described in more detail with reference to Equation 3.

$$\text{for}(k=0; (N_i[Q]<<k)<A_i[Q]; k++) \qquad \text{[Equation 3]}$$

Here, it is assumed that the context model parameter Q used to encode the residual value of the current pixel is '0' and the index 'i' indicating the residual value group to which the residual value of the current pixel belongs is '1.' In order to obtain $k_{11}$ illustrated in FIG. 5, Q=0 and i=1 are substituted for Equation 3 and $k_{11}$ may be obtained as in Equation 4.

$$\text{for}(k=0; (N_1[0]<<k)<A_1[0]; k++) \qquad \text{[Equation 4]}$$

According to Equation 4, when '$(N_1[0]<<k)<A_1[0]$' is satisfied according to 'for', k increases by 1 and a loop is repeated. Each time the loop is repeated, $N_1[0]$ is shifted by k bits. In other words, $N_1[0]$ is multiplied by $2^k$. When the condition '$(N_1[0]<<k)<A_1[0]$' is no longer satisfied while the value of k increases each time the loop is repeated, loop repetition is completed and the value of k is output. This value becomes $k_{11}$. In other words, the maximum positive number greater than 0 which satisfies $N_i[Q]\times 2^k<A_i[Q]$ is determined as the Golomb code parameter to be used in entropy encoding the residual value of the current pixel.

When $k_{11}$ is determined, the context model parameters are renewed. That is, the context model parameters $N_i[Q]$ and $A_i[Q]$ are renewed. For example, when $k_{11}$ described in relation to Equation 4 is obtained, the context model parameters $N_i[Q]$ and $A_i[Q]$ are renewed. $N_1[0]$ increases by '1' and $A_1[0]$ increases by the absolute value of the residual value of the current pixel. When the Golomb code parameter is determined, the code selecting unit 120 selects the Golomb code table according to the Golomb code parameter, as will be described in more detail with reference to FIG. 5.

FIG. 5 is a table showing the Golomb code table according to an exemplary embodiment of the present invention.

Referring to FIG. 5, when the Golomb code parameter used to entropy encode the residual value of the current pixel is determined, the code table is selected according to the determined Golomb code parameter. In FIG 5, the Golomb code parameter is the order of the Golomb code.

Referring back to FIG. 1, the prediction unit 130 subtracts the predicted value from the pixel value of the current pixel and generates the residual value. A method of generating the predicted value of the current pixel is not particularly restricted and the predicted value of the current pixel may be generated as in Equation 5 according to JPEG-LS.

if(Rc>=max(Ra, Rb))

Px=min(Ra, Rb);

else {if(Rc<=min(Ra, Rb)) Px=max(Ra, Rb); else
Px=Ra+Rb−Rc; } [Equation 5]

As described above with reference to FIG. 2 and Equation 1, Ra is a value restored after encoding the pixel value of the pixel position a 220, Rb is a value restored after encoding the pixel value of the pixel position b 222, Rc is a value restored after encoding the pixel value of the pixel position c 224, and Rd is a value restored after encoding the pixel value of the pixel position d 226. In a lossless image encoding method, Ra is the same as the pixel value of the pixel position a 220, Rb is the same as the pixel value of the pixel position b 222, Rc is the same as the pixel value of the pixel position c 224, and the Rd is the same as the pixel value of the pixel position d 226. Px is a predicted value at the current pixel x 210.

When the predicted value of the current pixel is generated as in Equation 5, the prediction unit 130 subtracts the predicted value from the pixel value and generates the residual value. The generated residual value is provided to the code selecting unit 120 and is used to select the code table.

The entropy encoding unit 140 entropy encodes the residual value generated in the prediction unit 130 according to the code table selected in the code selecting unit 120. The entropy encoding is performed by corresponding the residual value to a binary code according to the selected code table from among the code table illustrated in FIG. 5. In addition, the entropy encoding unit 140 encodes the index indicating the residual value group, to which the residual value of the current pixel belongs, and generates a bitstream.

As described above in relation to the context model unit 110 and the code selecting unit 120, the code table is selected based on the context model and the residual value group, to which the residual value of the current pixel belongs, in order to entropy encode the residual value of the current pixel. Accordingly, in order to entropy decode the residual value of the current pixel, information about the context model and the residual value group, to which the residual value of the current pixel belongs, is needed. In entropy decoding, the context model is determined from other pixel values adjacent to the current pixel. However, the residual value group, to which the residual value of the current pixel belongs, may not be determined from other pixel values. Thus, the entropy encoding unit 140 encodes the index i indicating the residual value group, to which the residual value of the current pixel belongs, along with the residual value.

Figure 6:
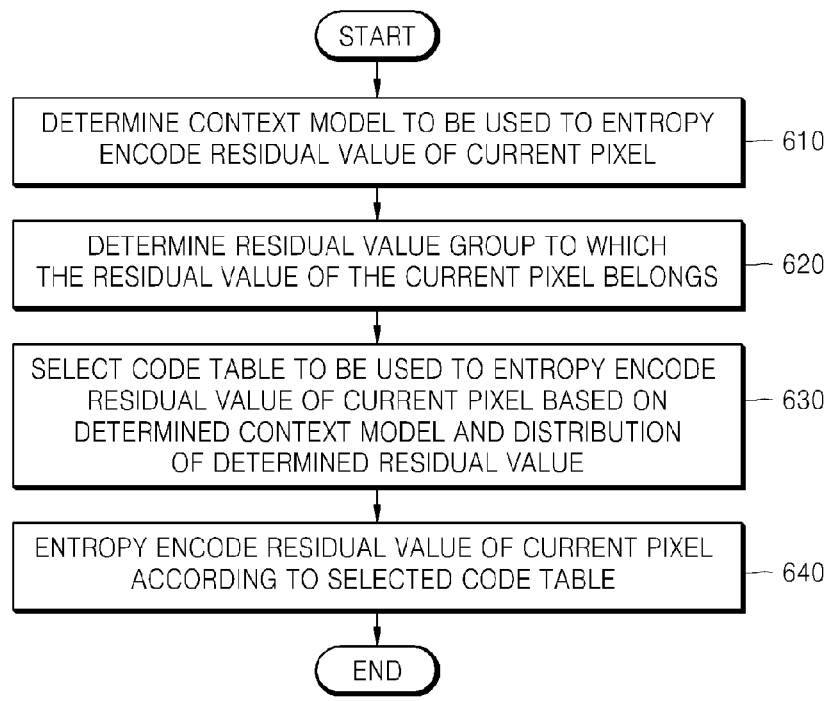
FIG. 6 is a flowchart illustrating a method of encoding an image according to an exemplary embodiment of the present invention.

FIG. 6 is a flowchart illustrating a method of encoding an image according to an exemplary embodiment of the present invention.

Referring to FIG. 6, the apparatus 100 for encoding an image determines a context model to be used to entropy encode a residual value of a current pixel, in operation 610. The context model is determined with reference to at least one pixel value that is encoded before the current pixel, as described above with reference to FIG. 2.

In operation 620, the apparatus 100 for encoding an image determines a residual value group, to which the residual value of the current pixel belongs, from among a plurality of residual value groups encoded based on the context model determined in operation 610.

As described with reference to FIG. 3, the residual values encoded according to one context model may represent a plurality of distributions. Accordingly, the apparatus 100 for encoding an image decides which of the distributions the residual value of the current pixel comply with and determines the residual value group, to which the residual value of the current pixel belongs. When the residual value distribution of the residual value of the current pixel is determined according to the characteristics of the image area, to which the current pixel belongs, the residual value group, to which the residual value of the current pixel belongs, is determined based on the determined residual value distribution.

In operation 630, the apparatus 100 for encoding an image selects the code table to be used to entropy encode the residual value of the current pixel based on the context model determined in operation 610 and the residual value group determined in operation 620. The code table to be used to entropy encode the residual value of the current pixel is selected based on the context model parameter allocated to the residual value group determined in operation 620.

The Golomb code parameter is determined based on the context model parameter of the residual value group determined in operation 620 and the code table is selected according to the Golomb code parameter. The Golomb code parameter may be the order of the Golomb code.

In operation 640, the apparatus 100 for encoding an image entropy encodes the residual value of the current pixel according to the code table selected in operation 630. The entropy encoding is performed by corresponding the residual value to the binary code according to the selected code table. Here, the index indicating the residual value group, to which the residual value of the current pixel belongs, is also encoded, thereby generating a bitstream.

Figure 7:
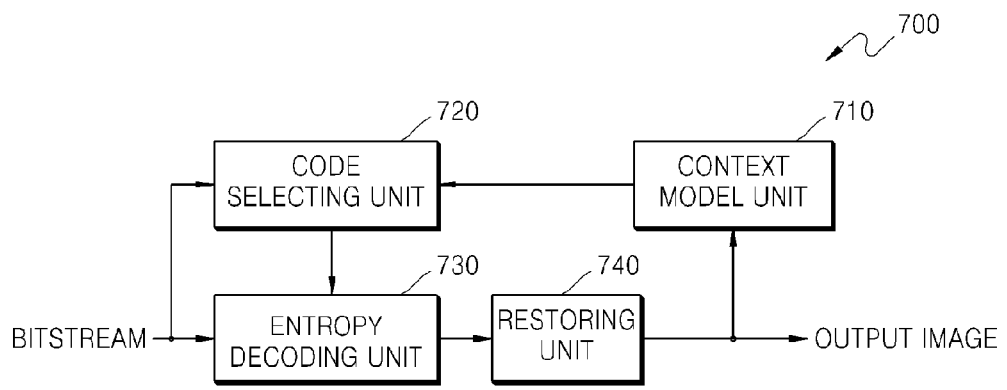
FIG. 7 is a block diagram of an apparatus for decoding an image according to an exemplary embodiment of the present invention.

FIG. 7 is a block diagram of an apparatus 700 for decoding an image according to an exemplary embodiment of the present invention.

Referring to FIG. 7, the apparatus 700 for decoding an image includes a context model unit 710, a code selecting unit 720, an entropy decoding unit 730, and a restoring unit 740.

The context model unit 710 determines a context model to be used to entropy decode a residual value of a current pixel with reference to at least one pixel value that is decoded before the current pixel. The context model is determined with reference to at least one pixel value that is decoded before the current pixel and is restored in the restoring unit 740. A method of determining the context model may be the same as the method described with reference to the apparatus 100 for encoding an image, which is described above with reference to FIG. 2 and Equations 1 and 2.

As described with reference to Equations 1 and 2, the encoded pixel values that are encoded before the current pixel and are adjacent to the current pixel are used to calculate the gradient values of D1, D2, and D3 and the calculated gradient values are compared with the threshold values $T_1$, $T_2$, $T_3$, and NEAR, thereby generating vector ($Q_1$, $Q_2$, $Q_3$). The generated vector correspond, on a one-to-one basis, to Q, which is an index of the context model, thereby determining the context model.

The code selecting unit 720 selects the code table to be used to entropy decode the residual value of the current pixel using the context model determined in the context model unit 710. The code table is selected with reference to the context model determined in the context model unit 710 and information about the residual value group, to which the current pixel belongs, included in the bitstream. The information about the residual value group may be an index indicating the residual value group and the residual value group may be determined according to the characteristics of an image area, to which the residual value of the current pixel belongs.

The code selecting unit 720 determines the residual value group, to which the residual value of the current pixel belongs, from among a plurality of residual value groups according to the context model determined in the context model unit 710 based on the index indicating the residual value group. Then, the context model parameter allocated to the determined residual value group is used to select the code table used to entropy decode the residual value of the current pixel.

The context model parameter of the determined residual value group may include a parameter indicating the number of pixels included in the determined residual value group from among the at least one pixel, that is decoded before the image processing unit to which the current pixel belongs, and a parameter indicating the sum total of the absolute value of the residual value of the pixels included in the determined residual value group, as described with reference to Equation 3.

The context model parameter is used to determine the Golomb code parameter according to Equation 3 and the code table is selected according to the determined Golomb code parameter.

The entropy decoding unit 730 entropy decodes the residual value of the current pixel by using the code table selected in the code selecting unit 720. Entropy decoding is performed by corresponding the residual value to a binary code according to the selected code table.

The restoring unit 740 restores the pixel value of the current pixel. The pixel value is restored by adding a predicted value to the residual value of the current pixel entropy decoded in the entropy decoding unit 730.

The predicted value of the current pixel may be generated with reference to the pixel value that is decoded before the current pixel. A method of generating the predicted value may be the same as the prediction method used to encode the current pixel, as described with reference to Equation 5.

Figure 8:
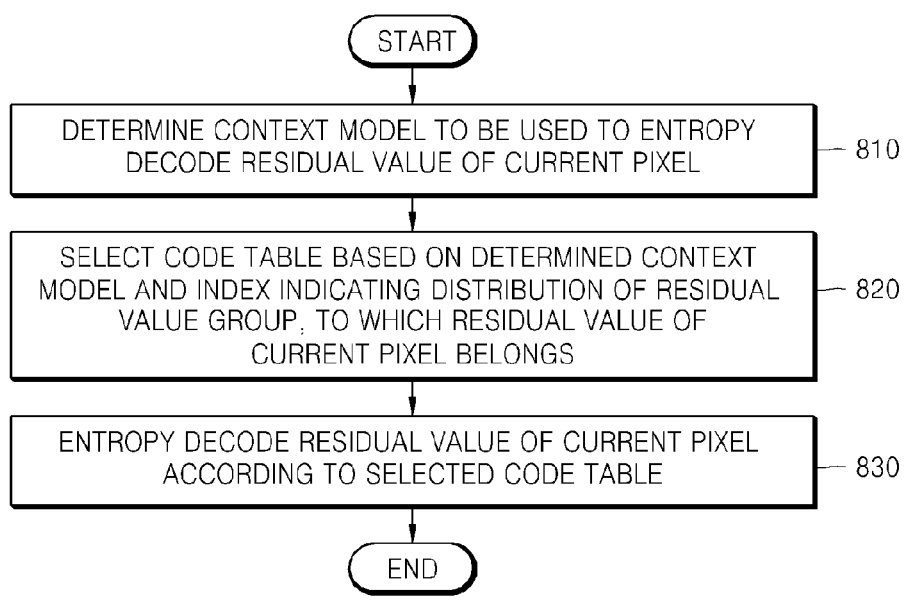
FIG. 8 is a flowchart illustrating a method of decoding an image according to an exemplary embodiment of the present invention.

FIG. 8 is a flowchart illustrating a method of decoding an image according to an exemplary embodiment of the present invention.

Referring to FIG. 8, the apparatus 700 for decoding an image determines the context model to be used to entropy decode the residual value of the current pixel, in operation 810. The context model is determined with reference to at least one pixel value decoded that is before the current pixel, as described above with reference to FIGS. 2 and 7.

In operation 820, the apparatus 700 for decoding an image selects the code table used to entropy decode the residual value of the current pixel based on the context model determined in operation 810 and the index indicating the residual value group, to which the residual value of the current pixel belongs, included in the bitstream. The code table to be used to entropy decode the residual value of the current pixel is selected based on the context model parameter allocated to the residual value group determined according to the index in operation 820.

The Golomb code parameter is determined based on the context model parameter of the residual value group determined according to the index in operation 820 and the code table is selected according to the Golomb code parameter. The Golomb code parameter may be the order of the Golomb code.

In operation 830, the apparatus 700 for decoding an image entropy decodes the residual value of the current pixel according to the code table selected in operation 820. The entropy decoding is performed by corresponding the binary code to the residual value according to the code table selected in operation 830. The residual value generated as a result of the entropy decoding is restored by being added to the predicted value of the current pixel.

According to an exemplary embodiment of the present invention, the code table may be selected in consideration of not only the context model but also the distribution of the residual value of the current pixel, thereby entropy encoding the residual value of the current pixel with high compressibility.

For example, the apparatuses 100 and 700 for encoding and decoding an image may include buses coupled to each element illustrated in FIGS. 1 and 7 and at least one processor connected to the buses. In addition, a memory, which is connected to the buses to store commands, received messages, or generated messages and is coupled to the at least one processor for executing the commands, may be included.

The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of decoding an image, the method comprising:
   determining a context model to be used to entropy decode a residual value of a current pixel with reference to at least one pixel value that is decoded before the current pixel;

determining an index indicating a residual value group to which the residual value belongs based on the determined context model;

determining a context model parameter of the residual value group indicated by the index comprising a parameter indicating the number of pixels included in the residual value group and a parameter for the sum total of the absolute values of the residual value of the pixels included in the residual value group indicated by the index;

selecting a code table based on the determined context model parameter of the residual value group indicated by the index; and entropy decoding the residual value according to the selected code table.

2. The method of claim 1, wherein the residual value group is determined according to characteristics of an image area, from among a plurality of residual value groups.

3. The method of claim 2, wherein the residual value group according to characteristics of an image area is determined according to a distribution of the residual values included in the image area.

4. The method of claim 1, wherein the selecting of the code table comprises:

determining Golomb code parameters based on the determined context model and the index indicating the residual value group; and selecting a Golomb code table to be used to entropy decode the residual value according to the determined Golomb code parameters.

5. The method of claim 4, wherein the Golomb code parameters are determined based on a context model parameter of the residual value group indicated by the index from among context model parameters allocated to each of the plurality of residual value groups.

6. The method of claim 5, wherein the context model parameter of the residual value group indicated by the index comprises a parameter indicating the number of pixels included in the residual value group indicated by the index from among the at least one pixel that is decoded before an image processing unit including the current pixel and a parameter for the sum total of the absolute values of the residual value of the pixels included in the residual value group indicated by the index.

7. The method of claim 6, wherein the determining of the Golomb code parameters comprises obtaining a maximum positive number k that is greater than 0 and satisfies $N_i[Q] \times 2^k < A_i[Q]$, wherein Q represents an index indicating the context model to be used to decode the current pixel, i represents an index indicating the residual value group, $N_i[Q]$ represents a parameter for the number of the pixels included in the residual value group indicated by the index, and $A_i[Q]$ represents a parameter for the sum total of the absolute values of the residual value of the pixels included in the residual value group indicated by the index.

8. The method of claim 7, wherein the determining of the Golomb code parameters further comprises renewing $N_i[Q]$ and $A_i[Q]$.

9. The method of claim 1, wherein the at least one pixel value that is encoded before the current pixel corresponds to at least one pixel that is adjacent to the current pixel.

10. The method of claim 3, wherein the distribution of the residual values is determined according to characteristics of the image area.

11. The method of claim 9, wherein the context model is determined using differences between restored values of the at least one pixel value corresponding to at least one pixel that is adjacent to the current pixel.

12. An apparatus for decoding an image, the apparatus comprising:

a context model unit that determines a context model to be used to entropy decode a residual value of a current pixel with reference to at least one pixel value that is decoded before the current pixel;

a code selecting unit that determines an index indicating a residual value group to which the residual value belongs based on the determined context model, determines a context model parameter of the residual value group indicated by the index comprising a parameter indicating the number of pixels included in the residual value group and a parameter for the sum total of the absolute values of the residual value of the pixels included in the residual value group indicated by the index and selects a code table based on the determined context model parameter of the residual value group indicated by the index; and an entropy decoding unit that entropy decodes the residual value according to the selected code table.

13. The apparatus of claim 12, wherein the residual value group is determined according to characteristics of an image area, from among a plurality of residual value groups.

14. The apparatus of claim 12, wherein the code selecting unit determines Golomb code parameters based on the determined context model and the index indicating the residual value group and selects a Golomb code table to be used to entropy decode the residual value according to the determined Golomb code parameters.

15. The apparatus of claim 14, wherein the code selecting unit determines the Golomb code parameters based on a context model parameter of the residual value group indicated by the index from among the context model parameters allocated to each of the plurality of residual value groups.

16. The apparatus of claim 15, wherein the context model parameter of the residual value group indicated by the index comprises a parameter indicating the number of pixels included in the residual value group indicated by the index from among the at least one pixel that is decoded before an image processing unit including the current pixel and a parameter for the sum total of the absolute values of the residual value of the pixels included in the residual value group indicated by the index.

17. The apparatus of claim 12, wherein the at least one pixel value that is encoded before the current pixel corresponds to at least one pixel that is adjacent to the current pixel.

18. The method of claim 17, wherein the context model is determined using differences between restored values of the at least one pixel value corresponding to at least one pixel that is adjacent to the current pixel.

19. A non-transitory computer readable recording medium having embodied thereon a computer program for executing a method of decoding an image, the method comprising:

determining a context model to be used to entropy decode a residual value of a current pixel with reference to at least one pixel value that is decoded before the current pixel;

determining an index indicating a residual value group to which the residual value belongs based on the determined context model;

determining a context model parameter of the residual value group indicated by the index comprising a parameter indicating the number of pixels included in the residual value group and a parameter for the sum total of the absolute values of the residual value of the pixels included in the residual value group indicated by the index;

selecting a code table based on the determined context model parameter of the residual value group indicated by the index; and entropy decoding the residual value according to the selected code table.

\* \* \* \* \*